United States Patent
Ho et al.

(10) Patent No.: US 7,115,526 B2
(45) Date of Patent: Oct. 3, 2006

(54) METHOD FOR WET ETCHING OF HIGH K THIN FILM AT LOW TEMPERATURE

(75) Inventors: Hsieh Yue Ho, HsinChu (TW); Chih-Cheng Wang, HsinChu (TW); Hsiao Shih-Yi, Taibau (TW); Kang Tsung-Kuei, Hsinchu (TW); Bing-Yue Tsui, Hsinchu (TW); Chih-Feng Huang, Changhua (TW); Jann-Shyang Liang, Kinmen (TW); Ming-Huan Tsai, Jubei (TW); Hun-Jan Tao, Hsinchu (TW); Baw-ching Perng, Hsinchu (TW)

(73) Assignee: Grand Plastic Technology Corporation Taiwan (TW)

( * ) Notice: Subject to any disclaimer, the term of this patent is extended or adjusted under 35 U.S.C. 154(b) by 0 days.

(21) Appl. No.: 10/101,076

(22) Filed: Mar. 18, 2002

(65) Prior Publication Data

US 2003/0148625 A1 Aug. 7, 2003

(51) Int. Cl.
*H01L 21/302* (2006.01)
*H01L 21/461* (2006.01)

(52) U.S. Cl. .................. 438/745; 438/754; 438/756; 438/757

(58) Field of Classification Search ............... 438/745, 438/754–757, 396–399
See application file for complete search history.

(56) References Cited

U.S. PATENT DOCUMENTS

| 4,800,170 A | * | 1/1989 | Jain et al. ................. 438/694 |
| 5,693,553 A | * | 12/1997 | Kashihara et al. ......... 438/240 |
| 6,410,386 B1 | * | 6/2002 | Hsue et al. ................ 438/253 |
| 6,465,853 B1 | * | 10/2002 | Hobbs et al. .............. 257/410 |

OTHER PUBLICATIONS

Wolf et al., Silicon Processing for the VLSI Era, vol. 1, 1986, pp. 407–409, 533–535.*

* cited by examiner

*Primary Examiner*—Duy-Vu N. Deo
(74) *Attorney, Agent, or Firm*—Perkins Coie LLP

(57) ABSTRACT

The present invention discloses an electrode structure of a light emitted diode and manufacturing method of the electrodes. After formed a pn junction of a light emitted diode on a substrate, a layer of SiO2 is deposited on the periphery of the die of the LED near the scribe line of the wafer, then a transparent conductive layer is deposited blanketly, then a layer of gold or AuGe etc. is formed with an opening on the center of the die. After forming alloy with the semiconductor by heat treatment to form ohmic contact, a strip of aluminum (Al) is formed on one side of the die on the front side for wire bonding and to be the positive electrode of the LED. The negative electrode is formed on the substrate by metal contact. Another form of the electrode structure of the present invention is making both the positive and negative electrodes on the front side of the LED by etching the p-type semiconductor of the pn junction and forming a strip of negative electrode on the n-type semiconductor, the positive electrode is formed on the p-type semiconductor.

23 Claims, 11 Drawing Sheets

METHOD FOR WET ETCHING OF HIGH K THIN FILM AT LOW TEMPERATURE

BACKGROUND OF THE INVENTION

1. Field of the Invention

The present invention relates to a semiconductor device manufacturing method and more particularly, to a method for wet etching of high k thin film at low temperature.

2. Description of Relative Prior Art

The recent development of semiconductor such as CMOS logic device or dynamic random access memory (DRAM), is preferable to increase the integration, increase the capacity, decrease the driving voltage etc., to meet the requirement of high speed, less delay. The design rule is more and more quickly reduced. It is a result that the thickness of the gate oxide is decreasing and approaching 60A or less. The fabrication process is more difficult to control. In a capacitor of a DRAM, a silicon dioxide insulator or an oxide-nitride-oxide (ONO) can not satisfy the need of the memory charge capacity, it is a trend that high dielectric film is used as the insulating film of a capacitor to replace the silicon dioxide or ONO. Recently, as the design rule approach 0.18 μm, there are lots of gate dielectric material can be used. The main requirement is: high dielectric, low leakage current, easy to etch and less contamination to the active area, etc. The most preferred material is Hafnium oxide ($HfO_2$) or Zirconium oxide ($ZrO_2$). Although they have an idea dielectric constant of 15–25, and more stable that they do not diffuse into the silicon active area, and the leakage current is less, but it is not easy to be etched. The experiment data is shown in Table 1.

TABLE 1

| Chemical | Etch rate of $HfO_2$ (A/min) |
| --- | --- |
| Pure $HClO_4$ | 0.3 |
| Pure $H_2SO_4$ (at 160° C.) | 1.25–5.25 |
| Pure $H_3PO_4$ (at 80° C.) | 0 |
| BOE | 20 |
| Pure $(COOH)_2$ | 0–2 |
| Pure HCl | 0–0.9 |
| Pure HBr | 2.5–10 |
| Pure HI | 0 |
| Pure HF | 101 |
| Pure $H_2O_2$ | 0 |
| TMAH | 0.4 |

From Table 1, we know that etching with Sulfuric acid ($H_2SO_4$) need to heat up to 160° C. and the etch rate is only 5A/min, the others like Phosphoric acid ($H_3PO_4$), acitic acid $(COOH)_2$, Hydrochloric acid (HCl), Hydro Bromide acid (HBr), Hydro iodine acid (HI), and pure $HClO_4$, has etch rate near zero. Although BOE and HF has etch rate of 20A/min and 100A/min respectively, but cannot be used since they also etch silicon dioxide. Poor selectivity of dry etching causes leakage current, which due to defects on the surface of the source/drain. So it needs to develop a new technique to replace wet etching by hot sulfuric acid and dry etching techniques.

FIG. 1 shows the cross section view before etching the gate dielectric of a CMOS device using Hafnium oxide ($HfO_2$) as the gate dielectric. Isolation 4 is formed on a silicon wafer 1 by LOGOS or STI, then using lithography and ion implantation to form a p-well 2 and n-well 3, after deposited Hafnium oxide film 5, poly-Si 6 and tungsten silicide or other silicide 7 formed a gate 9, the Hafnium oxide is now using as the etch stop. Then by using lithography and ion implantation to form a lightly doped n⁻ source/drain area 10 and p⁻ source/drain area 11. Refer to FIG. 2, by using lithography and ion implantation technique to form heavily doped n⁺ and p⁺ source/drain 12,13, thus form a LDD structure. Now the hafnium oxide has not etched away and is used as the buffer layer of ion implantation to prevent defects form on the surface of silicon. Finally, by using dry etching to remove the hafnium oxide above the source/drain area. The un-doped silicon glass (USG) and the silicon above the source/drain may form defects 14 since the selectivity is not high enough. After the process is completed the leakage current of the device will increase. The same reason is applied to the etching of the dielectric film of a DRAM, it may hurt the lower electrode and inter-metal-dielectric (IMD). Alternatively, if we use wet etching by hot sulfuric acid, the selectivity is good, but the etch rate is very low and need high temperature endurable equipments. It is preferred to develop a wet etch method at low temperature to improve the yield of production.

SUMMARY OF THE INVENTION

It is an object of the present invention to provide a method of wet etching a high k film and high k gate dielectric of a semiconductor device.

Another object of the present invention is to provide a method of wet etching a high k film which has high selectivity with respect to silicon dioxide ($SiO_2$), un-doped silicon glass (USG) and bulk silicon to reduced defects on USG in the isolation region, poly-Si gate and silicon of source/drain region, so that the leakage current and topology can be reduced.

The third object of the present invention is to provide a wet etch method at low temperature, which has acceptable etch rate, and the processing time can be reduced to increase throughput. In order to achieve the above objects, according to the first aspect of the present invention, a method using hydrofluoric acid (HF) and perchloric acid ($HClO_4$) (or perbromic acid $HBrO_4$, periodic acid $HIO_4$) mixture for etching the high k film on silicon dioxide ($SiO_2$) or poly-Si, the volume ratio is between 1:50 to 1:5000, the better is 1:1000 to 1:2500, at low temperature (0° C. to 100° C.), the etch rate of high k film is more than 10A/min. However the etch rate of $SiO_2$, USG and poly-Si is below 10A/min, the selectivity is good enough.

According to the second aspect of the present invention is to provide a method for manufacturing CMOS logic devices with high k gate dielectric film. After the gate, the lightly doped source/drain and the side-well of the gate has been formed, using HF and $HClO_4$ (or $HBrO_4$, $HIO_4$) mixture to etch the high k gate dielectric on the source/drain, would not hurt the USG in the shallow trench isolation region, the silicon surface of the source/drain region, the poly-Si gate and the metal gate or refractory metal silicide of the gate.

According to the third aspect of the present invention, is to provide a method for manufacturing DRAM with high k capacitor. After completed forming the transistor and lower electrode of a DRAM, and have deposited high k film as capacitor dielectric on the lower electrode, protect the bottom electrode and the high k film with photo resist, then remove the high k film by wet etch using HF and perchloric acid ($HClO_4$) (or perbromic acid $HBrO_4$, periodic acid $HIO_4$) mixture at low temperature (0° C. to 100° C.), very good etch pattern can be obtained, the etching process will not form defect on the BPSG or PSG under the high k film. The etch rate of high k film is above 10A/min, but the etch rate of BPSG or PSG is under 10A/min.

According to the fourth aspect of the present invention, is to provide a method for manufacturing high k capacitors. After a blanket deposition of high k dielectric film on the substrate having a lower electrode, protect the lower electrode and high k film on the lower electrode with photoresist, then remove the high k film by wet etch using HF and perchloric acid (or perbromic acid $HBrO_4$, periodic acid $HIO_4$) mixture at low temperature (0° C. to 100° C.). This etching process will not damage the silicon substrate or the isolation silicon dioxide.

DETAILED DESCRIPTION OF THE PREFERRED EMBODIMENT

Figure 1:
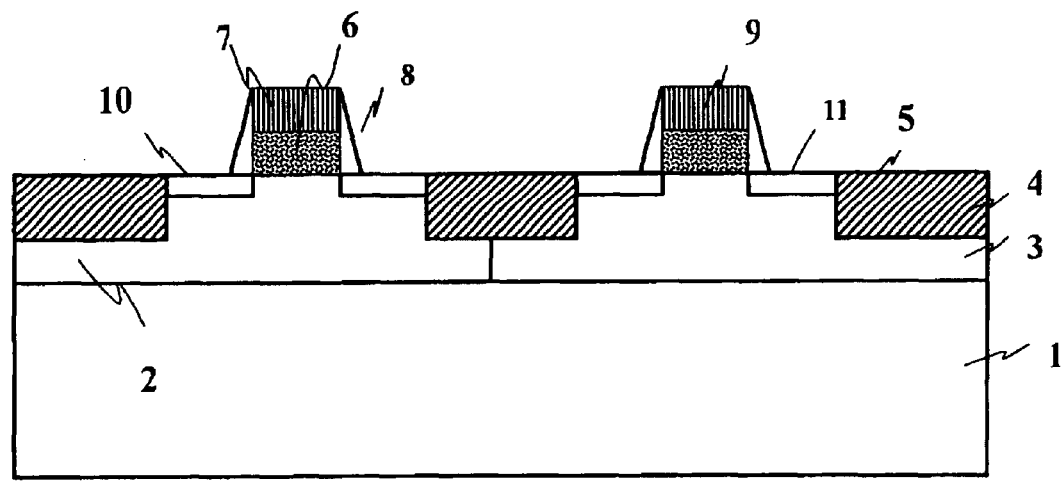
FIG. 1 is a cross section view of a CMOS after the front-end process has formed nitride side-wall of the gate and before etching the high k film of the prior art.
Figure 2:
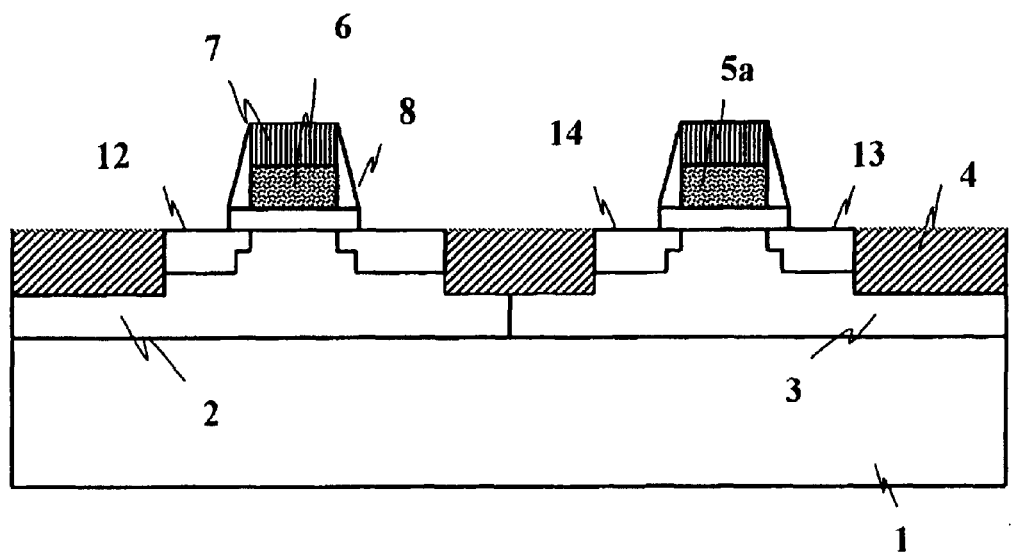
FIG. 2 is a cross section view of a CMOS after the front-end process has formed the heavily doped source/drain and etched away the high k film above the source/drain of the prior art.
Figure 3:
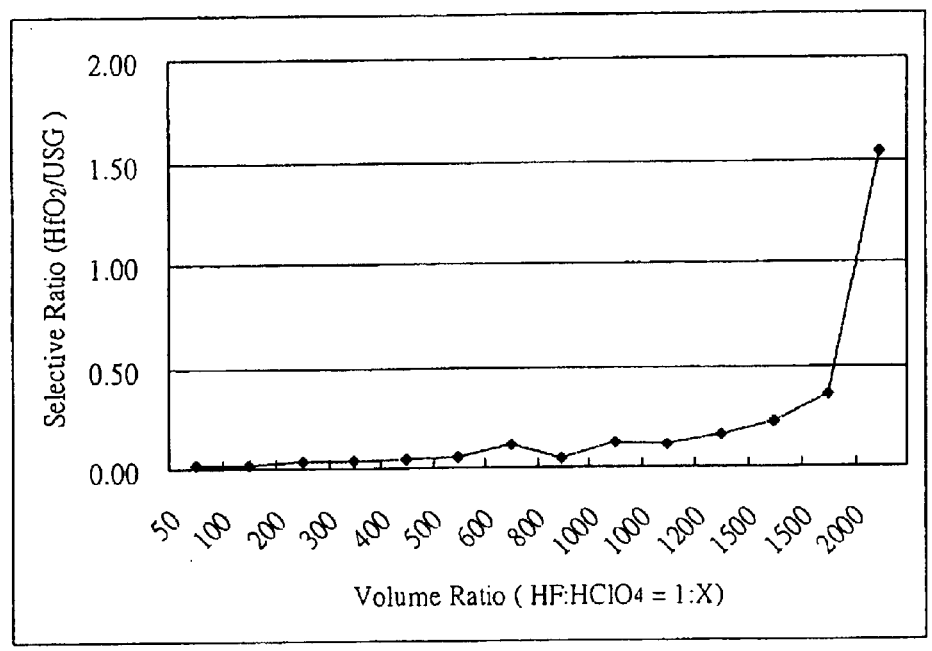
FIG. 3 is a graph of selectivity vs. different volume ratio of HF and $HClO_4$ for etching $HfO_2$ and USG.
Figure 4:
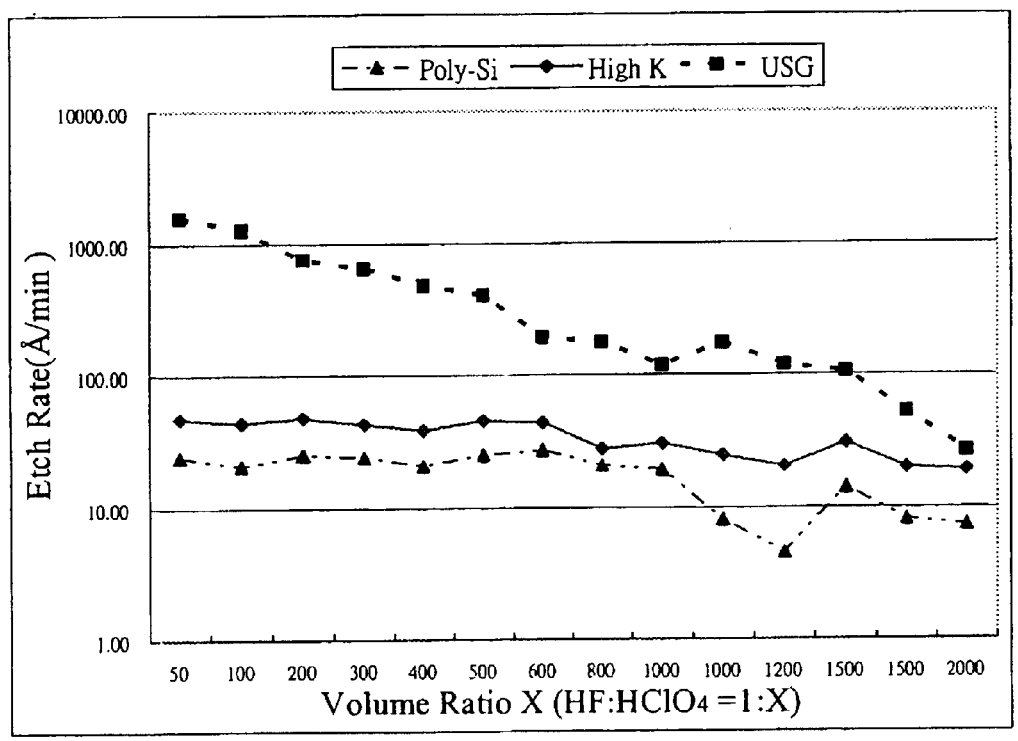
FIG. 4 is a graph of etch rate vs. different volume ratio of HF and $HClO_4$ for etching high k dielectric ($HfO_2$), USG and poly-Si.

Preferred embodiment of the present invention will now be explained with reference to the accompanying drawings First embodiment The etching of high k material ($HfO_2$) film has been studied with different solution by the inventors. All the $HfO_2$ film is deposited by Physical vapor deposition (PVD) or CVD, un-doped silicon glass (USG) or poly-Si is deposited by chemical vapor deposition (CVD), the thickness of the film before and after etching is measured by an n&k analyzer. Etching the high k film with $H_2SO_4$ at 160° C., the etch rate is 1.15~5.25A/min and the selectivity to USG is 1:1, can be acceptable, but high temperature endurable wet bench is needed. Etching with pure phosphoric acid ($H_3PO_4$), pure perchloric acid ($HClO_4$), pure hydrochloric acid (HCl), pure hydro bromide (HBr), pure hydroiodide (HI) or pure acitic acid $(COOH)_2$, the etch rate is too low and can not be used. Etching with dilute hydrochloric ($HF:H_2O=$1:2000), the etch rate of $HfO_2$ is 1A/min, but the etch rate of USG is as high as 7A/min., the selectivity of 1:7 can not be acceptable, it will damage the USG in the shallow trench isolation region. Using a mixture of HF and $HClO_4$ at low temperature with volume ratio of 1:50 to 1:5000, the etch rate is above 10A/min. with increasing $HClO_4$, the etch rate of USG is decreasing slowly, at volume ratio of 1:2000, the selectivity can approach 1:0.65 ($HfO_2$:USG) as shown in FIG. 3 and FIG. 4. FIG. 3 shows the selectivity curve of $HfO_2$ to USG when etching with a mixture of HF and $HClO_4$ with different volume ratio. The selectivity is increase from $HfO_2$:USG=1:66=0.015 to 1:0.65=1.54. FIG. 4 is the etch rate of $HfO_2$ using different volume ratio of HF: $HClO_4$ increasing from 1:5 to 1:2000, the etch rate of $HfO_2$ keep at a constant value above 10A/min., but to USG or poly-Si, the etch rate is below 10A/min. The results show that etching high k film °$HfO_2$ at low temperature (0° C.~100° C.) can get acceptable etch rate of 10A/min, and will not damage the USG on the STI region, the poly-Si, metal, refractory metal or silicide on the gate, or the poly-Si, BPSG or PSG on the lower electrode of a capacitor, and need not use high temperature endurable wet bench and suitable for mass production. At low temperature (0° C.~100° C.), with volume ratio of HF: $HClO_4$=1:50 to 1:5000, the etch rate of $HfO_2$ is acceptable and the selectivity to wet oxide, USG, BPSG or poly-Si is high enough for production, the best volume ratio is 1:1000 to 1:2500.

Etching can be carried out by using single wafer tools, batch type tools, clusters tools, or stand alone tools. Etching is not limited to a special tool, any tool which make the HF and the $HClO_4$ contact with the wafer can be used.

In addition, it is equivalent to replace the perchloric acid ($HClO_4$) with perbromic acid ($HBrO_4$), periodic acid ($HIO_4$), so the mixture is not limited to HF: $HClO_4$, but HF: $HBrO_4$ or HF: $HIO_4$ can be used.

Second embodiment

Figure 5:
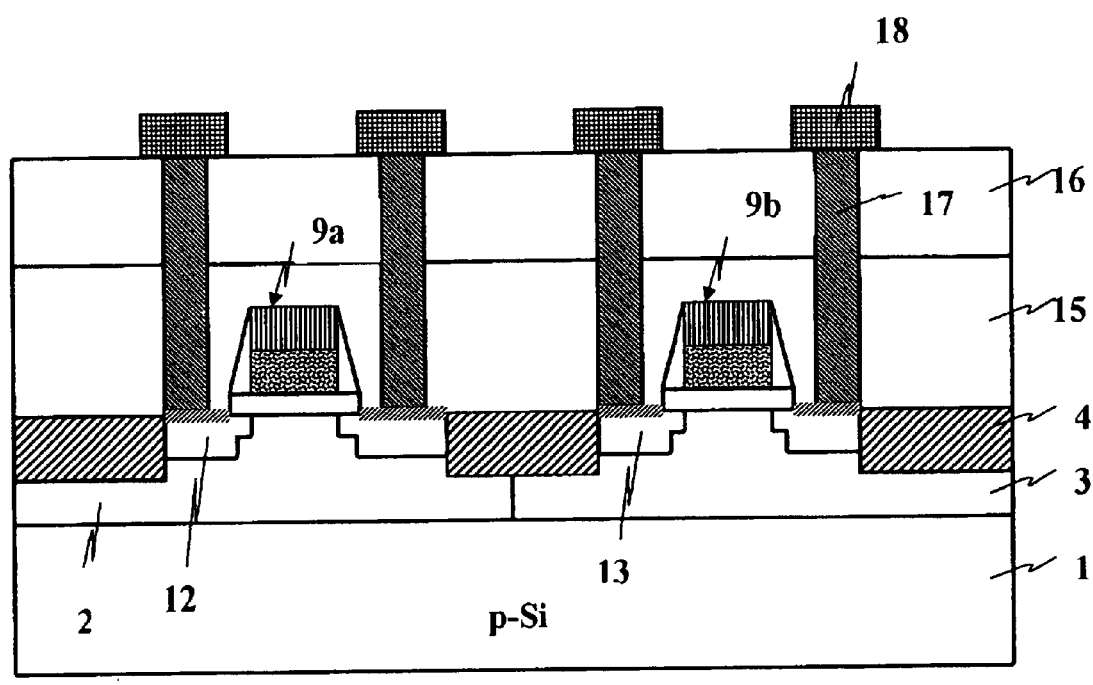
FIG. 5 is a cross section view of a CMOS logic device after the process is completed.

Refer to FIG. 5 to FIG. 15, which shows the process step of the manufacturing method of a CMOS 200. It is especially emphasis on the formation step and method of a high k gate. FIG. 5 shows the structure of a CMOS logic device 200. In the following description the silicon substrate is p-type, but n-type substrate or SOI (silicon on insulator) substrate can be used. The isolation of the second embodiment using shallow trench isolation is an example, but LOCOS isolation can be used. Tungsten silicide on poly-Si gate is used to reduce the gate resistance, but salicide like $TiSi_2$ or $CoSi_2$ can be used to replace WSiX. Also the gate is not limited to poly-Si gate, such as metal gate or refractory metal silicide can be used. The CMOS integration process which include the use of high k material should be included in the present invention.

Figure 6:
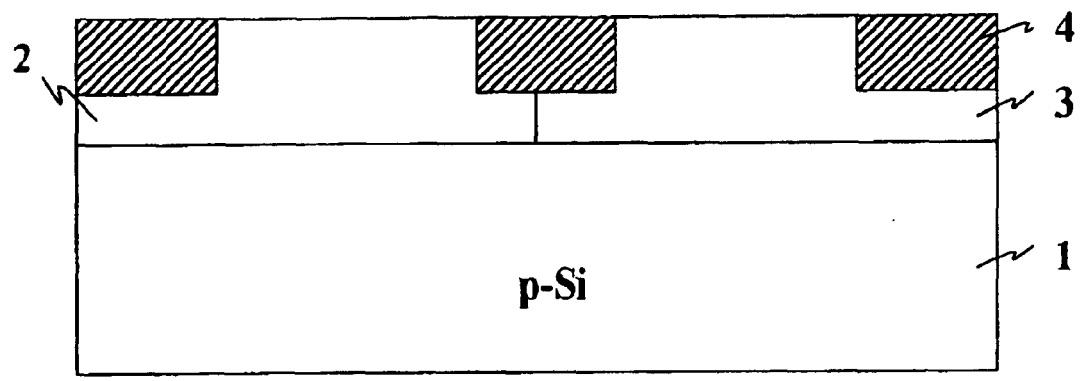
FIG. 6 is a cross section view of a CMOS substrate.
Figure 7:
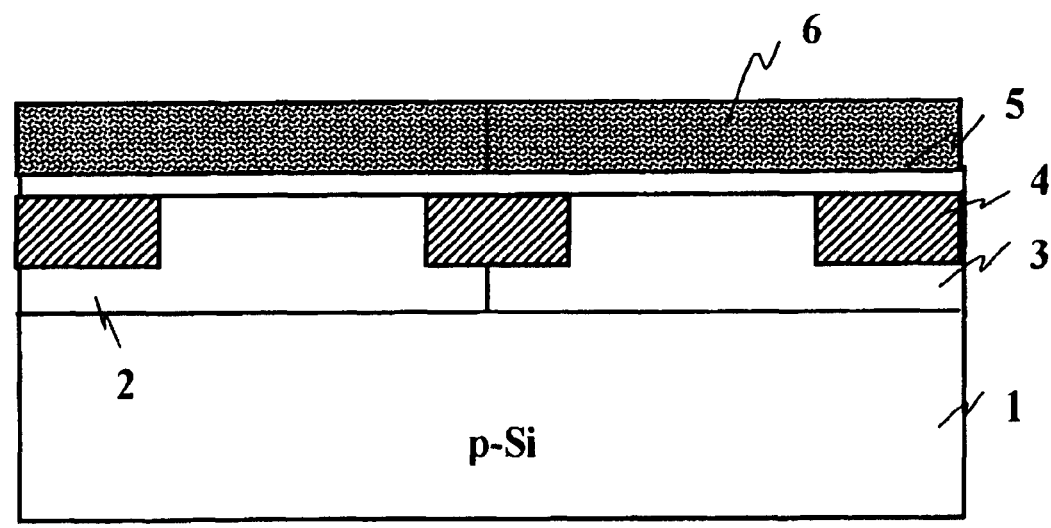
FIG. 7 is a cross section view after deposition of high k film ($HfO_2$) and poly-Si.

In step of FIG. 6, the active area is defined by selectively formed the device isolation STI on the p-type silicon substrate, then forms the p-well 2 and n-well 3 by lithography and ion implantation, therein the p-well region will be the NMOS area and the n-well region will be the PMOS area. Then in step of FIG. 7, high k film 5 (i.e. $HfO_2$ or $ZrO_2$) of gate dielectric is formed on the silicon substrate, then poly-Si 6 is deposited to form the poly silicon gate.

Figure 8:
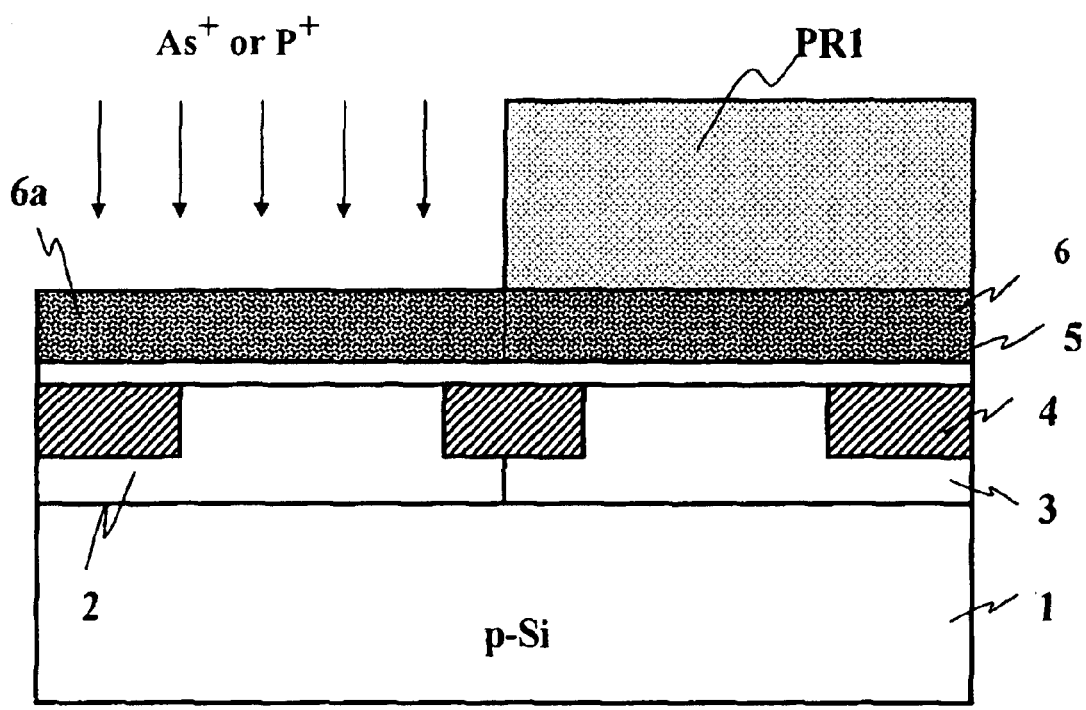
FIG. 8 is a cross section view after forming heavily doped $n^+$ poly-Si.

In step of FIG. 8, mask photo-resist PR1 is formed by lithography on the n-well region 3, then n-type dopant ($As^+$ or $P^+$) is implanted into the poly silicon 6 on the p-well region 2 to form $N^+$ low resistance poly silicon 6a.

Figure 9:
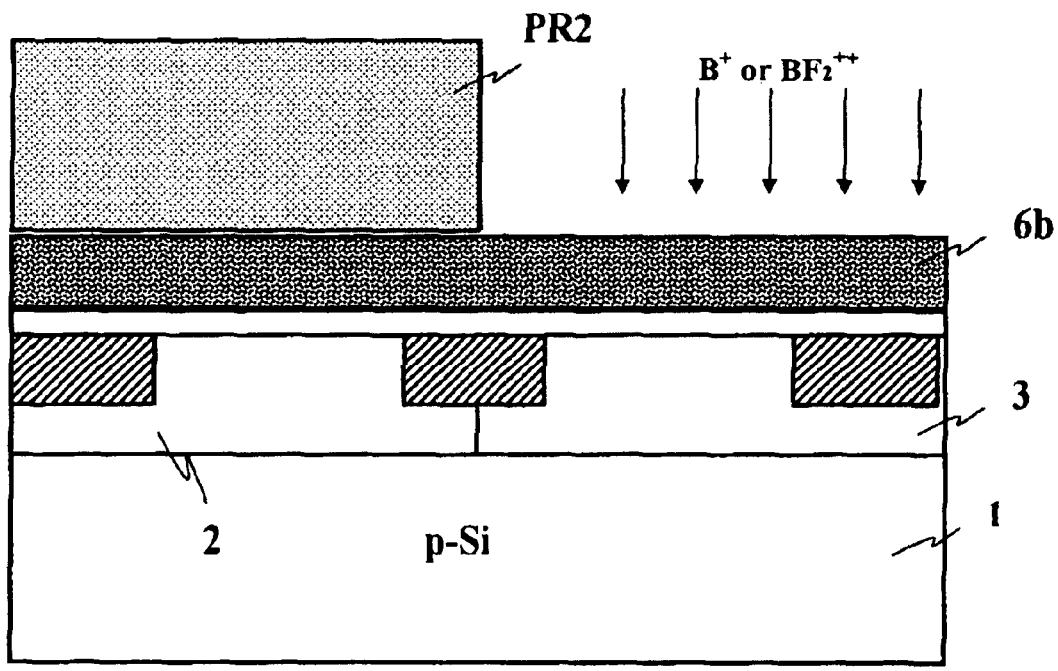
FIG. 9 is a cross section view after forming heavily doped $p^+$ poly-Si.

After removed the photo-resist PR1 as shown in FIG. 9, mask photo-resist PR2 is formed on the p-well region 2, p-type dopant ($B^+$ or $BF_2^{++}$) is implanted into the poly-silicon 6 on the n-well region 3 to form $p^+$ poly silicon 6b.

Figure 10:
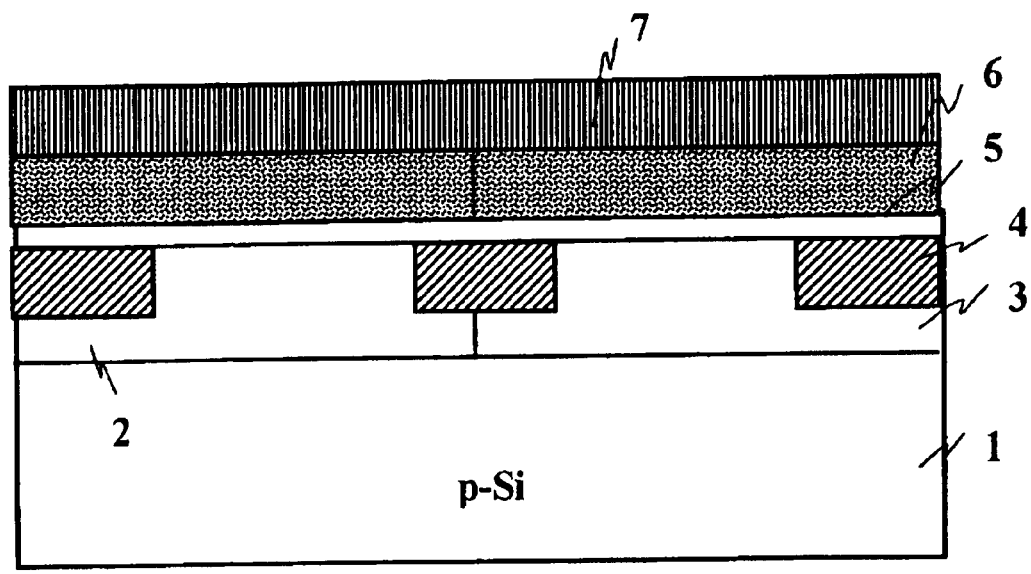
FIG. 10 is a cross section view after deposition of tungsten silicide.

After removed the photo-resist PR2, in step of FIG. 10, $WSi_x$ is deposited on the poly silicon 6a and 6b to form a low resistance gate. But $WSi_x$ can be replaced by self-aligned silicide which is formed together with the source/drain salicide.

Figure 11:
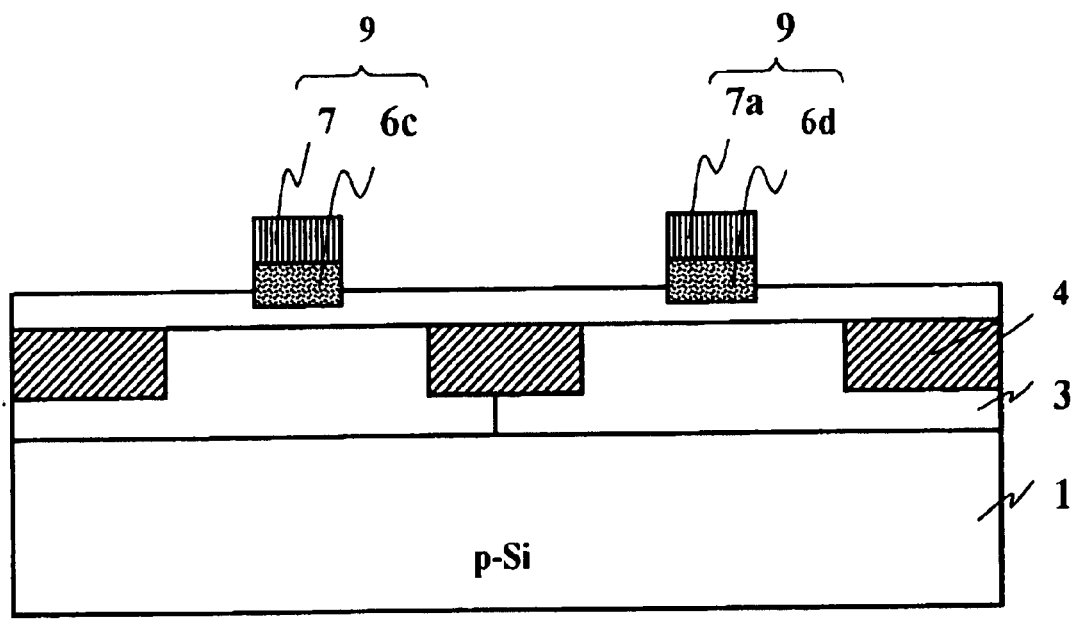
FIG. 11 is a cross section view after forming the gate by etching the tungsten silicide and poly-Si.

In step of FIG. 11, a gate pattern photo resist is formed on the tungsten silicide 7, then selectively etch the tungsten silicide 7 and poly silicon 6 to form the gate tungsten silicide 7a and 7b and gate poly silicon 6c and 6d to form gates 9a and 9b.

Figure 12:
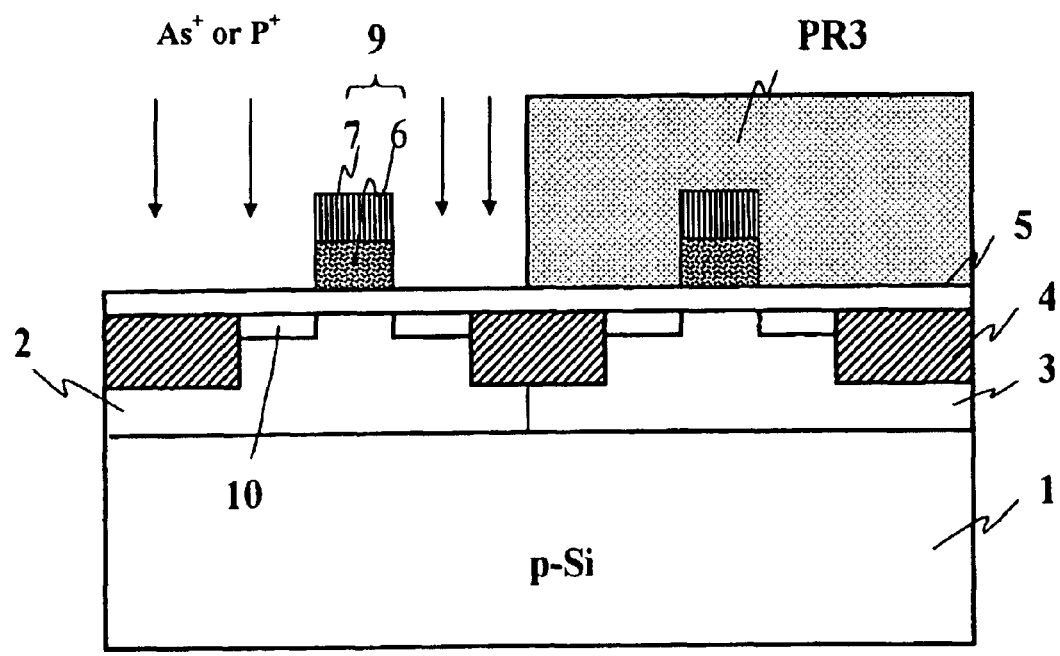
FIG. 12 is a cross section view after forming the lightly-doped $n^-$ source/drain.

In step of FIG. 12, photo resist PR3 is formed by lithography on the n-well 3, using PR3 and the gate 9a as mask, lowly doped ($1\times10^{13}\sim1\times10^{14}$ $cm^{-2}$) of n-type dopant ($As^+$ or $p^+$) is implanted into the p-well region to form $n^-$ source/drain 10.

Figure 13:
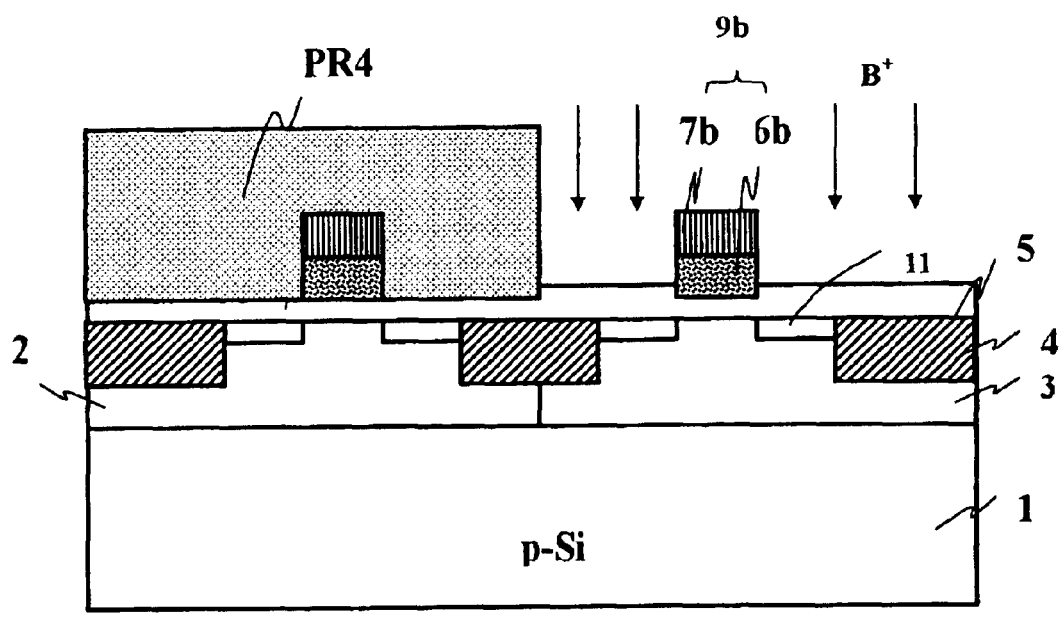
FIG. 13 is a cross section view after forming the lightly-doped $p^-$ source/drain.

After removed the photo-resist PR3, as shown in FIG. 13, photo resist PR4 is form on the p-well region 2, using PR4 and the gate 9b as mask, lowly doped ($1\times10^{13}\sim1\times10^{14}$ $cm^{-2}$) of p-type dopant ($B^+$) is implanted into the n-well region 3, to form $p^-$ source/drain 11.

Figure 14:
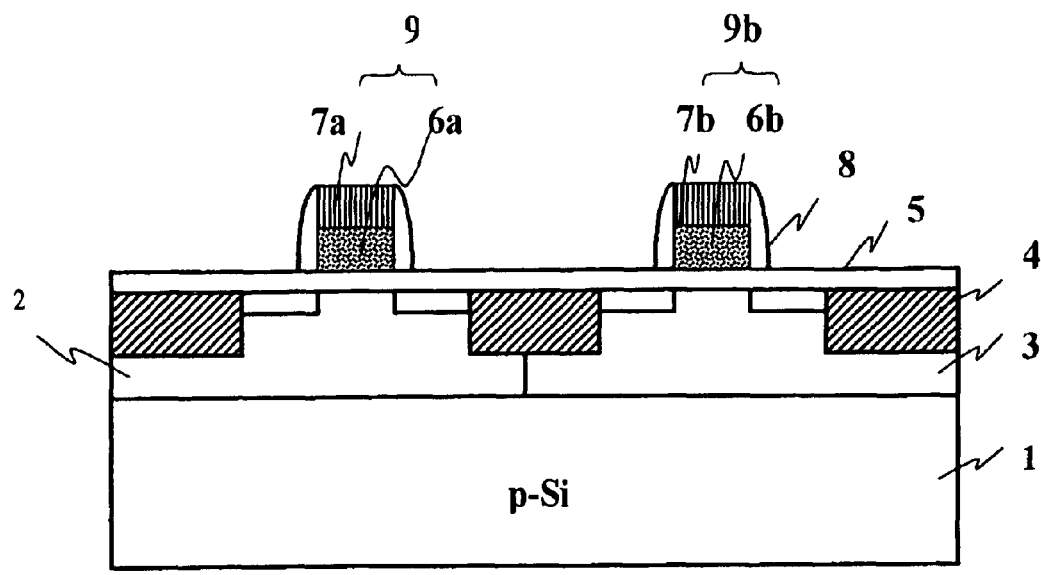
FIG. 14 is a cross section view after deposition of $Si_3N_4$ and anisotropic etching.

After removed the photo-resist PR4, a silicon nitride film is deposited, then anisotropic etching is used to form silicon nitride side-wall 8 as shown in FIG. 14. Now the high k film 5 is exposed except under the gates 9a, 9b and the side-wall 8.

Figure 15:
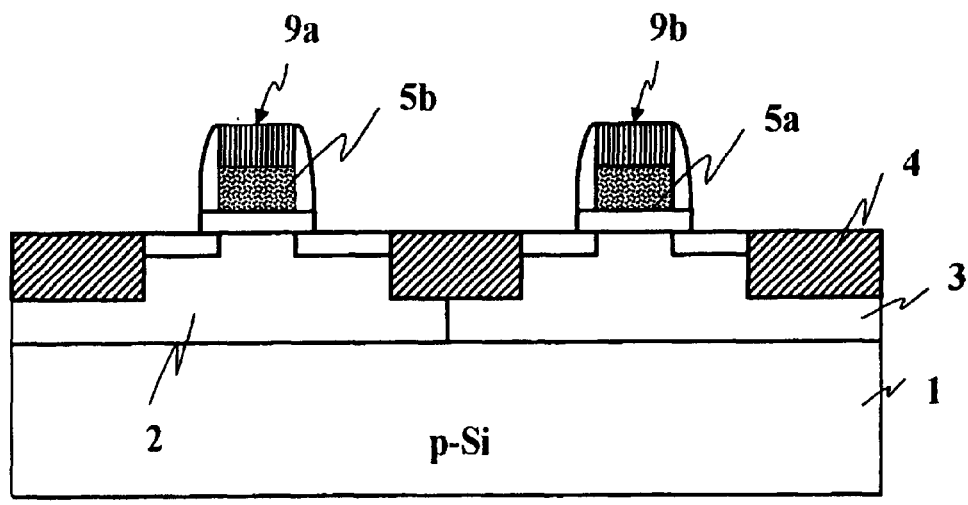
FIG. 15 is a cross section view after removed the high k ($HfO_2$) on the source/drain region with HF and $HClO_4$ mixture according the present invention.

In step of FIG. 15, using HF and $HClO_4$ (or $HBrO_4$, $HIO_4$) as the etch solution, the gates 9a and 9b, side-wall 8 as mask, remove the high k film above the source/drain and isolation region by wet etching at low temperature (0° C.~100° C.). The volume ratio of the HF: $HClO_4$ mixture is 1:50 to 1:5000, the better is 1:1000 to 1:2500. It is simple than etching by hot sulfuric acid ($HSO_4$). It need not high temperature endurable equipment, the etch rate is faster, and will not damage the surface of silicon and silicon dioxide (USG or wet oxide) that the leakage current is lower and the topology of the wafer is smooth.

The gate process is then completed, the following process is well known. For example, forming LDD by ion implantation of $n^+$ and $p^+$ to the source/drain region; forming salicide such as $TiSi_2$ or $CoSi_2$ on the source/drain, if WSix has not used, the salicide will form on the poly-Si gate in this step. Then complete the back-end process of metallization to complete the CMOS logic device as shown in FIG. 5.

Third embodiment

Figure 16:
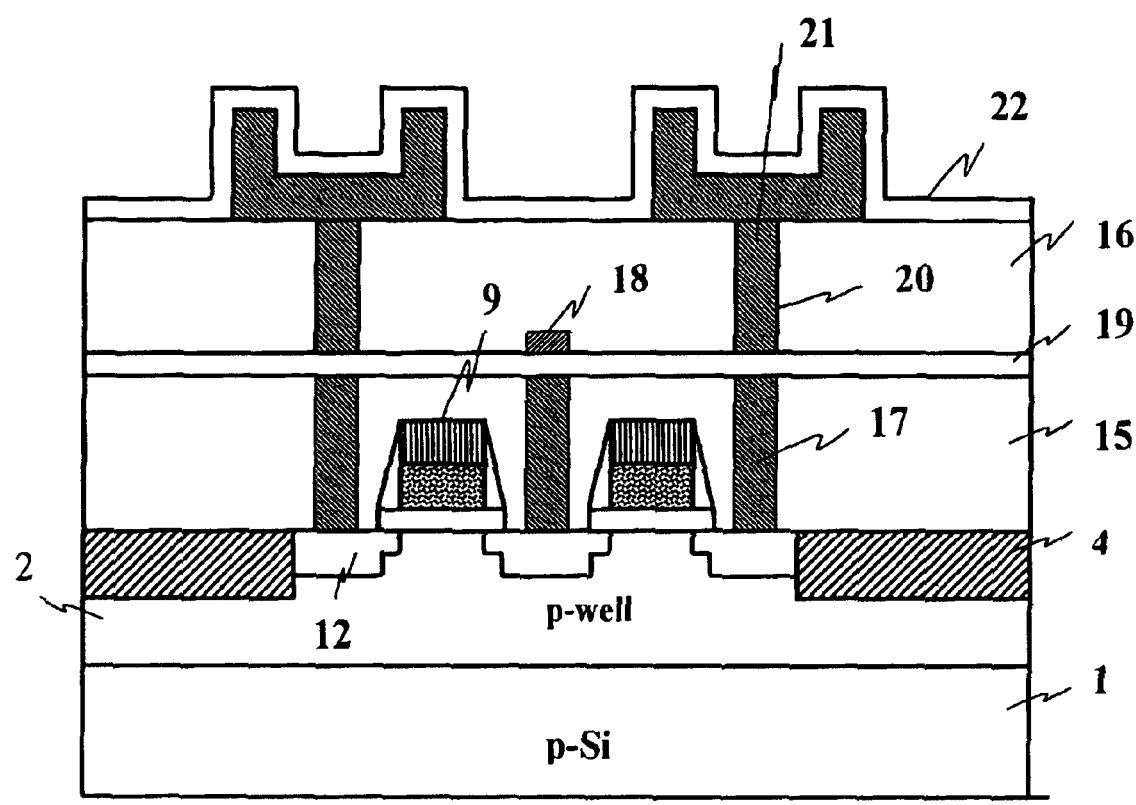
FIG. 16 is a cross section view after deposition of high k ($HfO_2$) on the stack electrode (lower electrode) of a DRAM according to the present invention.

FIG. 16 is a cross section view of a DRAM having high k dielectric insulator ($HfO_2$ or $ZrO_2$) after forming a stack lower electrode of the capacitor and having deposited high k film ($HfO_2$ or $ZrO_2$) according to the present invention. After forming a shallow trench isolation 4 on the p-well 2, LDD source/drain (or $n^+$ source/drain instead of LDD), gate 9, inter layer dielectric (ILD) 15, tungsten or poly-Si plug 17, BPSG inter metal dielectric (IMD) 16, silicon nitride etching stop layer 19 and lower electrode 21, then high k film 22 of the capacitor dielectric is deposited using PVD or CVD as shown in FIG. 16. The shape of the lower electrode is not limited to this stack type, other stack or trench capacitor can be used.

Figure 17:
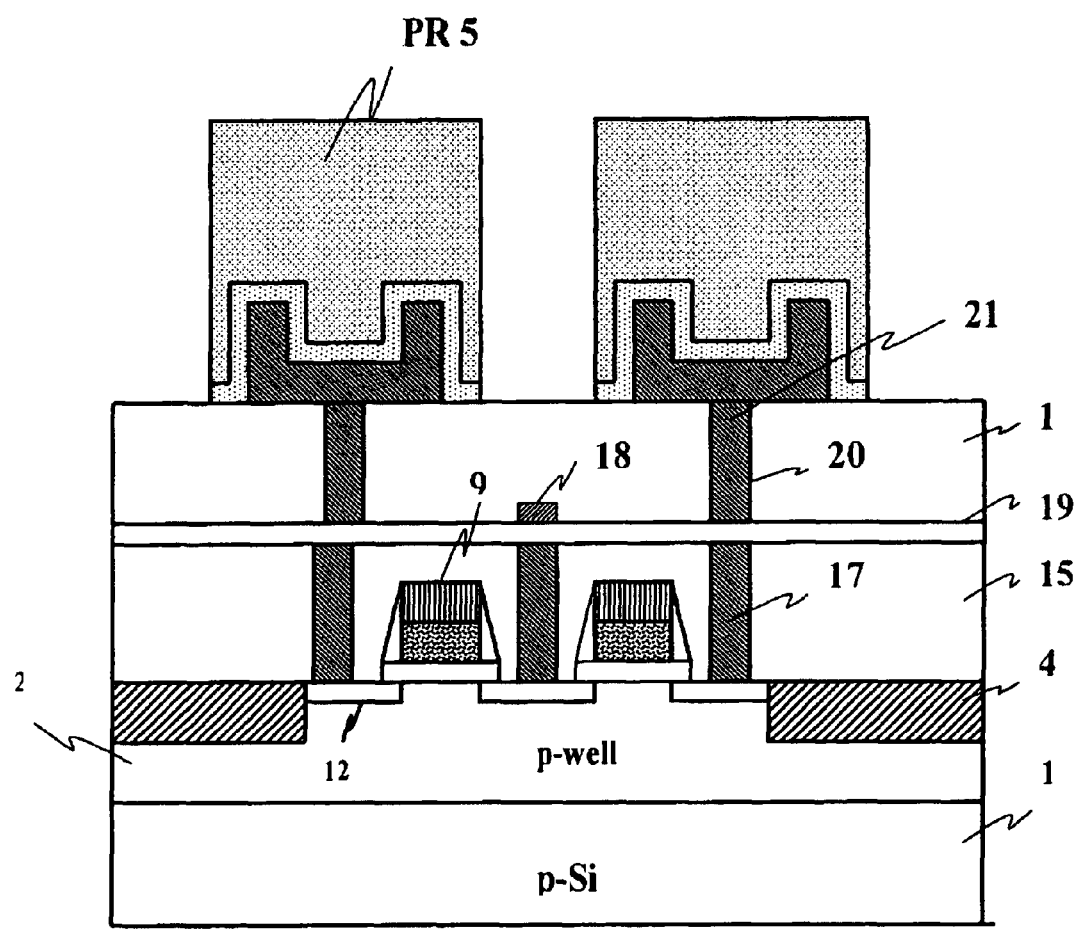
FIG. 17 is a cross section view after removed the high k ($HfO_2$) outside the capacitor region with HF and $HClO_4$ mixture according the present invention.
Figure 18:
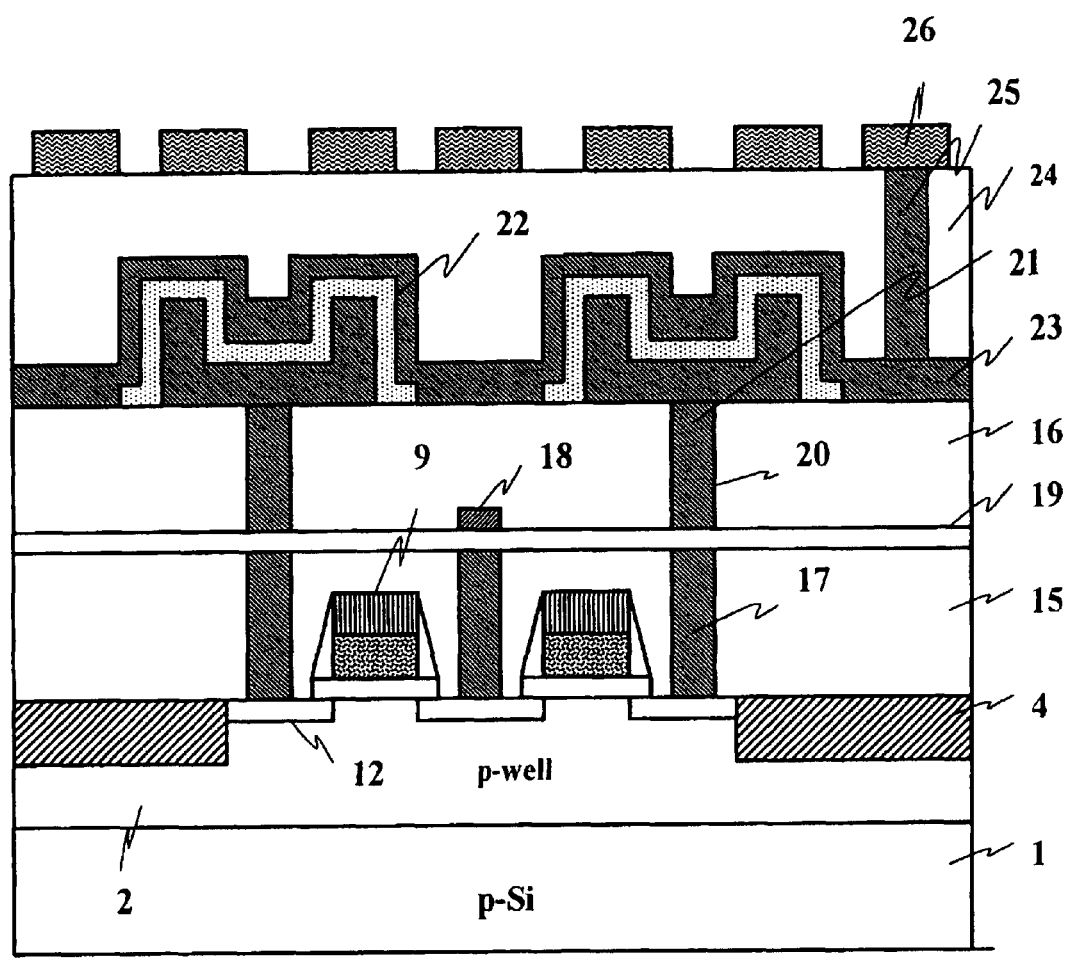
FIG. 18 is a cross section view after the process of a DRAM is completed according to the present invention.

Then, as shown in FIG. 17, etch the high k film using HF and $HClO_4$ (or $HBrO_4$, $HIO_4$) as the etch solution and photo-resist PR5 as the protection mask to protect the lower electrode and the high k film on the electrode, in an etching tool by wet etching at low temperature (0° C.~100° C.), to remove the high k film outside the lower electrode. The volume ratio of the mixture of HF: $HClO_4$ is 1:50 to 1:5000, the better is 1:1000 to 1:2500. It is simple than etching by hot sulfuric acid ($H_2SO_4$). It need not high temperature endurable equipment, the etch rate is faster, and will not damage the BPSG of the inter metal dielectric 16 that the leakage current is lower and the topology of the wafer is smooth.

Then the following process step (not shown) such as deposition of the poly-Si top electrode 23 and another IMD layer 24, grounding the capacitor from the top electrode by a via hole 25 to the bonding pad 26, as shown in FIG. 17 are very simple to those skill in IC technology, will not describe further.

Fourth embodiment

The other embodiment of the present invention is the application of a high k capacitor. Deposited a high k film as the dielectric of the capacitor on the substrate which having formed the lower electrode of the capacitor, then by using lithography to form a protection photo-resist to protect the high k film on the lower electrode, etch the high k dielectric at low temperature (0° C~100° C.) with a mixture of HF: $HClO_4$ (or $HBrO_4$, $HIO_4$). After that, deposited the top electrode and complete the following metallization process. High quality etching of the high k film can be achieved.

The above described embodiment intended to illustrate the present invention, not to limit the scope of the present invention, various embodiments and changes can be made thereonto without departing the broad spirit and scope of the invention, or application on other device etching within the meaning of an equivalent of the claims of the invention and within the claims are to be regarded to be in the scope of the present invention.

What is claimed is:

1. A method of high dielectric film wet etching, comprising the steps of:
   preparing a wafer having deposited a high dielectric film on silicon dioxide or poly-silicon;
   etching the high dielectric film with an etching agent by wet etching, wherein the etching agent is selected from a group consisting of a) hydrofluoric acid ($HClO_4$) and perbromic acid ($HBRO_4$), b) hydrofluoric acid ($HClO_4$) and periodic acid ($HIO_4$), and c) hydrofluoric acid (HF) and perchloric acid ($HClO_4$);
   rinsing the wafer with de-ionized water;
   rying the wafer.

2. A process for manufacturing a gate structure of a MOSFET, said process comprising:
   providing a wafer having said gate structure partially manufactured in that a front-end processing has been completed, whereby said gate includes shallow trench isolation, p-well and n-well regions, a high dielectric film and conductive layer over said gate, a lightly doped source/drain region, and a pair of silicon nitride side-walls on said gate;
   wet etching said high dielectric film to expose said source/drain region, said wet etching performed with a mixture including hydrofluoric acid (HF) and perchloric acid (HClO$_4$);

doping the source/drain region to obtain a highly doped source/drain region; and performing a back-end metallization process.

3. A process for manufacturing a gate structure of a MOSFET as recited in claim 2, wherein said act of wet etching is performed in a manner suitable for forming a capacitor of a DRAM.

4. A process for manufacturing a gate structure of a MOSFET as recited in claim 2, wherein said act of wet etching is performed in a manner suitable for forming a high dielectric capacitor.

5. A process for manufacturing a gate structure of a MOSFET as recited in claim 2, wherein said high dielectric film includes Hafnium oxide.

6. A process for manufacturing a gate structure of a MOSFET as recited in claim 2, wherein said high dielectric film includes Zirconium oxide.

7. A process for manufacturing a gate structure of a MOSFET as recited in claim 2, wherein said mixture has a volume ratio of HF:HClO$_4$ from about 1:50 to about 1:5000.

8. A process for manufacturing a gate structure of a MOSFET as recited in claim 2, wherein said mixture has a volume ratio of HF:HClO$_4$ from about 1:1000 to about 1:2500.

9. A process for manufacturing a gate structure of a MOSFET as recited in claim 2, wherein said wet etching is performed in a temperature range from about 0 deg C to 100 deg C.

10. A process for manufacturing a gate structure of a MOSFET as recited in claim 2, wherein said wet etching is performed in a single wafer tool.

11. A process for manufacturing a gate structure of a MOSFET as recited in claim 2, wherein said wet etching is performed in a batch type tool.

12. A process for manufacturing a gate structure of a MOSFET as recited in claim 2, wherein said wet etching is performed in a clusters type tool.

13. A process for manufacturing a gate structure of a MOSFET as recited in claim 2, wherein said wet etching is performed in a stand alone tool.

14. A process for manufacturing a gate structure of a MOSFET as recited in claim 2, wherein an etch rate of ZrO$_2$ is above about 10A/minute.

15. A process for manufacturing a gate structure of a MOSFET as recited in claim 2, wherein an etch rate of SiO$_2$ is below about 10A/minute.

16. A process for manufacturing a gate structure of a MOSFET as recited in claim 2, wherein an etch rate of undoped silicon glass (USG) is below about 10A/minute.

17. A process for manufacturing a gate structure of a MOSFET as recited in claim 2, wherein an etch rate of BPSG is below about 10A/minute.

18. A process for manufacturing a gate structure of a MOSFET as recited in claim 2, wherein an etch rate of PSG is below about 10A/minute.

19. A process for manufacturing a gate structure of a MOSFET as recited in claim 2, wherein an etch rate of poly-Si is below about 10A/minute.

20. A process for manufacturing a gate structure of a MOSFET as recited in claim 2, wherein an etch rate of Si is below about 10A/minute.

21. A process for manufacturing a gate structure of a MOSFET as recited in claim 2, wherein an etch rate of HfO$_2$ is above about 10A/minute.

22. A process for manufacturing a gate structure of a MOSFET, said process comprising:

providing a wafer having said gate structure partially manufactured in that a front-end processing has been completed, whereby said gate includes shallow trench isolation, p-well and n-well regions, a high dielectric film and conductive layer over said gate, a lightly doped source/drain region, and a pair of silicon nitride side-walls on said gate:

wet etching said high dielectric film to expose said source/drain region, said wet etching performed with a mixture including hydrofluoric acid (HF) and periodic acid (HIO$_4$);

doping the source/drain region to obtain a highly doped source/drain region; and performing a back-end metallization process.

23. A process for manufacturing a gate structure of a MOSFET, said process comprising:

providing a wafer having said gate structure partially manufactured in that a front-end processing has been completed, whereby said gate includes shallow trench isolation, p-well and n-well regions, a high dielectric film and conductive layer over said gate, a lightly doped source/drain region, and a pair of silicon nitride side-walls on said gate;

wet etching said high dielectric film to expose said source/drain region, said wet etching performed with a mixture including hydrofluoric acid (HF) and perbromic acid (HBRO$_4$);

doping the source/drain region to obtain a highly doped source/drain region; and performing a back-end metallization process.

* * * * *